United States Patent
Peeters et al.

(10) Patent No.: US 11,387,393 B2
(45) Date of Patent: Jul. 12, 2022

(54) LED LIGHT SOURCE WITH FLUORIDE PHOSPHOR

(71) Applicant: SIGNIFY HOLDING B.V., Eindhoven (NL)

(72) Inventors: Martinus Petrus Joseph Peeters, Weert (NL); Rene Theodorus Wegh, Veldhoven (NL); Remy Cyrille Broersma, Eindhoven (NL); Rene Jan Hendriks, Eindhoven (NL); Brankica Jovanovic, Eindhoven (NL)

(73) Assignee: SIGNIFY HOLDING B.V, Eindhoven (NL)

( * ) Notice: Subject to any disclaimer, the term of this patent is extended or adjusted under 35 U.S.C. 154(b) by 174 days.

(21) Appl. No.: 16/968,155

(22) PCT Filed: Feb. 12, 2019

(86) PCT No.: PCT/EP2019/053367
§ 371 (c)(1),
(2) Date: Aug. 6, 2020

(87) PCT Pub. No.: WO2019/155076
PCT Pub. Date: Aug. 15, 2019

(65) Prior Publication Data
US 2021/0384386 A1 Dec. 9, 2021

(30) Foreign Application Priority Data
Feb. 12, 2018 (EP) ..................................... 18156331

(51) Int. Cl.
*H01L 33/50* (2010.01)
*F21K 9/68* (2016.01)
(Continued)

(52) U.S. Cl.
CPC ............ *H01L 33/504* (2013.01); *C09K 11/61* (2013.01); *F21K 9/68* (2016.08); *F21V 9/30* (2018.02);
(Continued)

(58) Field of Classification Search
CPC ....... H01L 33/504; H01L 33/508; F21V 9/30; C09K 11/61; F21K 9/68
See application file for complete search history.

(56) References Cited

U.S. PATENT DOCUMENTS

2015/0048399 A1* 2/2015 Weiler ................ C09K 11/025
427/157
2015/0270451 A1 9/2015 Chowdhury et al.
(Continued)

FOREIGN PATENT DOCUMENTS

JP 2012-151466 A 8/2012
JP 2015-029052 A 2/2015
(Continued)

*Primary Examiner* — Karabi Guharay
(74) *Attorney, Agent, or Firm* — Daniel J Piotrowski

(57) ABSTRACT

The invention provides a lighting device (1) comprising a solid state light source (10) configured to generate light source light (11) and a converter element (100) configured to convert at least part of the light source light (11) into converter element light (101), wherein the converter element (100) comprises a polymeric host matrix element (120) hosting a particulate first luminescent material (110) of the type $M_2AX_6$ doped with tetravalent manganese, wherein M comprises an alkaline cation, wherein A comprises a tetravalent cation, and wherein X comprises a monovalent anion, at least comprising fluorine (F), wherein the particulate first luminescent material (110) is available in the polymeric host matrix element (120) with an average weight percentage x averaged over the polymeric host matrix element (120), wherein the polymeric host matrix element (120) has a first outer face (121), wherein an outer layer
(Continued)

volume defined by at least part of the first outer face (121) and a first distance (d1) from said first outer face (121) hosts the particulate first luminescent material (110) with a first local weight percentage y averaged over the outer layer volume with a ratio of the first local weight percentage y over the averaged weight percentage x of y/x≤0.1, and wherein the first distance (d1) is at least 10 μm.

14 Claims, 3 Drawing Sheets

(51) Int. Cl.
    *F21V 9/30*       (2018.01)
    *H01L 33/00*     (2010.01)
    *C09K 11/61*     (2006.01)
    *H01L 33/60*     (2010.01)
    *F21Y 115/10*    (2016.01)

(52) U.S. Cl.
    CPC .......... *H01L 33/005* (2013.01); *H01L 33/508* (2013.01); *H01L 33/60* (2013.01); *F21Y 2115/10* (2016.08); *H01L 2933/0041* (2013.01); *H01L 2933/0058* (2013.01)

(56) References Cited

U.S. PATENT DOCUMENTS

| | | |
|---|---|---|
| 2016/0133799 A1 | 5/2016 | Park et al. |
| 2016/0155909 A1 | 6/2016 | Lee et al. |
| 2016/0329471 A1* | 11/2016 | Weiler .................. G02F 1/1336 |
| 2017/0107425 A1 | 4/2017 | Kaneyoshi et al. |
| 2017/0158957 A1 | 6/2017 | Hong et al. |
| 2017/0256687 A1 | 9/2017 | Yoo et al. |
| 2017/0294561 A1 | 10/2017 | Ikeda et al. |

FOREIGN PATENT DOCUMENTS

| | | |
|---|---|---|
| JP | 2017-188592 A | 10/2017 |
| WO | 2013088313 A1 | 6/2013 |

* cited by examiner

LED LIGHT SOURCE WITH FLUORIDE PHOSPHOR

CROSS-REFERENCE TO PRIOR APPLICATIONS

This application is the U.S. National Phase application under 35 U.S.C. § 371 of International Application No. PCT/EP2019/053367, filed on Feb. 12, 2019, which claims the benefit of European Patent Application No. 18156331.3, filed on Feb. 12, 2018. These applications are hereby incorporated by reference herein.

FIELD OF THE INVENTION

The invention relates to a lighting device, a lamp or luminaire comprising such lighting device, as well as to a method for making a polymeric host material comprising a luminescent material, such as for use in such lighting device.

BACKGROUND OF THE INVENTION

Semiconductor lighting devices with luminescent materials are known in the art. US2017/0158957, for instance, describes a light source provided on a backlight for a color image display device which has a semiconductor light emitting device comprising a solid light emitting device to emit light in a blue or deep blue region or in an ultraviolet region and phosphors, in combination. The phosphors comprise a green emitting phosphor and a red emitting phosphor. The green emitting phosphor and the red emitting phosphor are ones, of which the rate of change of the emission peak intensity at 100° C. to the emission intensity at 25° C., when the wavelength of the excitation light is 400 nm or 455 nm, is at most 40%. This document mentions $K_2[AlF_5]:Mn^{4+}$, $K_3[AlF_6]:Mn^{4+}$, $K_3[GaF_6]:Mn^{4+}$, $Zn_2[AlF_7]:Mn^{4+}$, $K[In2F_7]:Mn^{4+}$, $K_2[SiF_6]:Mn^{4+}$, $Na_2[SiF_6]:Mn^{4+}$, $K_2[TiF_6]:Mn^{4+}$, $K_3[ZrF_7]:Mn^{4+}$, $Ba[TiF_7]:Mn^{4+}$, $K_2[SnF_6]:Mn^{4+}$, $Na_2[TiF_6]:Mn^{4+}$, $Na_2[ZrF_5]:Mn^{4+}$, $KRb[TiF_6]:Mn^{4+}$ and $K_2[Si_{0.5}Ge_{0.5}F_6]:Mn^{4+}$.

SUMMARY OF THE INVENTION

The luminescent material $K_2SiF_6:Mn^{4+}$ seems to enable a significant efficiency gain for warm white LEDS, especially for the high CRI. However, it appears that in the presence of moisture, light and elevated temperature the luminescent material slowly degrades, i.e. the quantum efficiency decreases leading to a color point shift. In addition to this slow process, a more severe, faster degradation mechanism can occur, if the luminescent material particles are directly exposed to water (i.e. not protected by silicone). The luminescent material appears to get brown when exposed to water. The presence of the brown material may lead to a strong decrease of the LED output, and therefore to local heating. The silicone can become too hot which may induce a LED failure, such as due to wire bond breakage.

Hence, it is an aspect of the invention to provide an alternative lighting device and/or a method of providing a host matrix for the luminescent material, which preferably further at least partly obviate one or more of above-described drawbacks. The present invention may have as object to overcome or ameliorate at least one of the disadvantages of the prior art, or to provide a useful alternative.

It surprisingly appears that luminescent material particles further away from the silicone-air interface will not substantially brown, even though water molecules can reach the particles through the silicone.

Therefore, in a first aspect the invention provides a lighting device comprising a light source, especially a solid state light source, configured to generate light source light, and a converter element, configured to convert at least part of the light source light into converter element light, wherein the converter element comprises a polymeric host matrix element ("host" or "matrix" or "polymeric matrix") hosting a particulate first luminescent material of the type $M_2AX_6$ doped with tetravalent manganese (and optionally other materials), wherein M comprises an alkaline cation, wherein A comprises a tetravalent cation, and wherein X comprises a monovalent anion, at least comprising fluorine (F), wherein the particulate first luminescent material is available in the polymeric host matrix element with an average weight percentage x averaged over the polymeric host matrix element (or "bulk weight percentage"), wherein the polymeric host matrix element has a first outer face, wherein an outer layer volume defined by at least part of the first outer face and a first distance from said first outer face hosts the particulate first luminescent material with a first local weight percentage y averaged over the outer layer volume with a ratio of the first local weight percentage y over the averaged weight percentage x of y/x≤0.1, especially y/x≤0.05, and wherein especially the first distance is at least 5 μm, such as especially at least 10 μm. An outer layer defined by at least part of the first outer face and the first distance from said first outer face comprises cavities.

It appears that such lighting device may have a much more stable color point and efficiency. Further, even when exposed to moisture, the color point and/or efficiency are not essentially affected, or affected to a much lower extend than a lighting device without such first luminescent material poor layer.

Instead of the term "luminescent material" also the term "phosphor" may be applied.

As indicated above, the lighting device comprises a solid state light source. The terms "light source" or "solid state light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In embodiments, the light source comprises a solid state light source such as a LED or laser diode. In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of light sources, such as 2-2000 solid state light sources.

The light source is configured to generate light source light. This light source light may especially comprise one or more of UV radiation and blue light. The terms "UV radiation", "UV light", or "UV emission" herein especially refer to radiation having a wavelength in the range of 300-380 nm, though smaller wavelengths may also be possible, such as in the range of 250-380 nm. The terms "blue light" or "blue emission" especially relates to light having a wavelength in the range of about 440-495 nm (including some violet and cyan hues). The light source light may be a narrow band, such as a full width half maximum of at maximum about 20 nm, within the UV or blue range, or may be a broad band within the UV and/or blue range. Especially, the light source generates the light source light having a spectral power distribution with at least 50% of the power, such as at least 80%, like at least 90%, within the UV and/or blue range, especially in the range of 300-495 nm.

The lighting device further comprises a converter element configured to convert at least part of the light source light into converter element light. Hence, the lighting device is especially configured to generate lighting device light, with the lighting device light comprising converter element light and optionally also light source light. Especially, when the light source light essentially consists of blue light, the lighting device light may also include light source light, such as to provide in embodiments white lighting device light.

Especially, the converter element is configured in a light receiving relationship with the light source. The converter element is especially radiationally coupled with the light source. The term "radiationally coupled" especially means that the light source and the luminescent material are associated with each other so that at least part of the radiation emitted by the light source is received by the luminescent material (and at least partly converted into luminescence). More especially, the converter element is especially configured downstream of the light source, and in a transmissive mode (whether or not light source light can escape from the converter element. Hence, when the lighting device light includes light source light, then the light source light has been transmitted through the light converter element.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The converter element comprises one or more different luminescent materials. The one or more luminescent materials may be chosen and configured by the person skilled in the art. However, the converter element at least comprises a polymeric host matrix element hosting a first luminescent material, especially a Mn(IV) ("tetravalent manganese") type luminescent material. Hence, in an embodiment the first luminescent material comprises a (red) luminescent material selected from the group consisting of Mn(IV) luminescent materials, even more especially the first luminescent material comprises a luminescent material of the type $M_2AX_6$ doped with tetravalent manganese, wherein M comprises an alkaline cation, wherein A comprises a tetravalent cation, and wherein X comprises a monovalent anion, at least comprising fluorine (F). For instance, $M_2AX_6$ may comprise $K_{1.5}Rb_{0.5}AX_6$. M relates to monovalent cations, such as selected from the group consisting of potassium (K), rubidium (Rb), lithium (Li), sodium (Na), cesium (Cs) and ammonium ($NH_4^+$), and especially M comprises at least one or more of K and Rb. Preferably, at least 80%, even more preferably at least 90%, such as 95% of M consists of potassium and/or rubidium. The cation A may comprise one or more of silicon (Si) titanium (Ti), germanium (Ge), stannum (Sn) and zinc (Zn). Preferably, at least 80%, even more preferably at least 90%, such as at least 95% of A consists of silicon and/or titanium and/or germanium (not taking into account the partial replacement by $Mn^{4+}$). Especially, M comprises potassium and A comprises titanium. X relates to a monovalent anion, but especially at least comprises fluorine. Other monovalent anions that may optionally be present may be selected from the group consisting of chlorine (Cl), bromine (Br), and iodine (I). Preferably, at least 80%, even more preferably at least 90%, such as 95% of X consists of fluorine. The term "tetravalent manganese" refers to $Mn^{4+}$. This is a well-known luminescent ion. In the formula as indicated above, part of the tetravalent cation A (such as Si) is being replaced by manganese. Hence, $M_2AX_6$ doped with tetravalent manganese may also be indicated as $M_2A_{1-m}Mn_mX_6$. The mole percentage of manganese, i.e. the percentage it replaces the tetravalent cation A will in general be in the range of 0.1-15%, especially 1-12%, i.e. m is in the range of 0.001-0.15, especially in the range of 0.01-0.12. Further embodiments may be derived from WO2013/088313, which is herein incorporated by reference.

Hence, in an embodiment the first luminescent material comprises $M_2AX_6$ doped with tetravalent manganese, wherein M comprises an alkaline cation, wherein A comprises a tetravalent cation, and wherein X comprises a monovalent anion, at least comprising fluorine. Even more especially, wherein M comprises at least one or more of K and Rb, wherein A comprises one or more of Si and Ti, and wherein X=F. An example of a suitable second luminescent material is e.g. $K_2SiF_6$:Mn (5%)(i.e. $K_2Si_{(1-x)}Mn_xF_6$, with x=0.05). Here, M is substantially 100% K, A is substantially 100% Si, but with a replacement thereof with 5% Mn (thus effectively 95% Si and 5% Mn), and X is substantially 100% F. In specific embodiments, M is essentially K. Such luminescent material may especially emit in the red, due to the tetravalent manganese. The term "first luminescent material" may also refer to a plurality of different first luminescent material of the type $M_2AX_6$ doped with tetravalent manganese, such as e.g. $K_2SiF_6$:Mn and $K_{1.5}Rb_{0.5}AX_6$. In embodiments, M comprises potassium and A comprises silicon. Hence, in embodiments the particulate first luminescent material comprises $K_2SiF_6$ doped with tetravalent manganese. Note that when there are different first luminescent materials, the weight percentage and/or y/x ratios relate to each type of first luminescent material, respectively.

Especially, the first luminescent material is a particulate first luminescent material. Good results may be obtained with relative large particles. Hence, in embodiments the particulate first luminescent material has a volume averaged particle size selected from the range of 5-50 µm, such as especially 10-40 µm, such as more especially a volume averaged particle size selected from the range of 15-40 µm. In embodiments, the particulate first luminescent material has a d50 value selected from the range of 5-50 µm, such as especially 10-40 µm, such as more especially 15-40 µm, like in the range of 20-35 µm. Further, especially at least 50 wt %, such as at least 80 wt % of the first luminescent material particles have particle sizes within the range of 10-40 µm, especially within the range of 15-µm, even more especially in the range of 20-35 µm. Further, when other luminescent materials are available in the host matrix (see also below), their volume averaged particle sizes are especially smaller, such as below in the range of about 7-20 µm. However, the volume averaged particle size may also be larger.

The particulate first luminescent material is available in the polymeric host matrix element with an average weight percentage x averaged over the polymeric host matrix element. Hence, the weight relates to the total weight of the polymeric host matrix element, including the polymeric material, the first luminescent material, and optionally other materials that are available in the host (like a second luminescent material and/or scattering particles, etc.). Hence, assuming by way of example polymeric material of the host matrix to be 50 parts, and the first luminescent material in the host matrix to be 50 parts, and no other materials in the polymeric host matrix element, the weight percentage x of the first luminescent material is 50 wt %. The weight percentage x thus refers to a bulk weight.

The precise weight percentage may depend on the thickness of the matrix, the spectral distribution of the light source light (which is used as excitation light by the luminescent material), the desired color point, the availability of other luminescent materials and/or scattering elements in the matrix, etc.

The term "polymeric host matrix element" refers to the polymeric host as well as the optional one or more non-host materials hosted by the polymeric host. Hence, herein the polymeric host matrix element comprises a polymeric host wherein the first outer layer comprises polymeric host material that may host the first luminescent material (in a reduced content) and that may host one or more other materials (such as a second luminescent material, a scattering material, etc.), but which may in embodiments essentially consist of the polymeric material (and thus effectively not having a hosting function), and a remaining part comprising polymeric host material hosting the first luminescent material and optionally hosting one or more other materials (such as a second luminescent material, a scattering material, etc.).

The converter element comprises the polymeric host matrix element and optionally one or more other elements, such as e.g. a layer, such as an optical layer, on the polymeric host matrix element (downstream of the polymeric host matrix element, such as on the first outer face), or a layer between a light emitting surface of the light source and the polymeric host matrix element (polymeric host matrix element), and/or a reflective layer, etc. Hence, in embodiments, in addition to the polymeric host matrix element the converter element may include other elements, such as optically functional layers.

The polymeric host matrix element has a first outer face. This first outer face may be the most remote configured part of the host matrix. Especially, the first outer face is a face from which converter light may escape from the host matrix to the external of the host matrix. Further, this first outer face especially refers to a face of the host matrix element that may be exposed to a gaseous environment. The host matrix may also include one or more other outer faces, which may e.g. be in contact with a support, and is (are) essentially not exposed to a gaseous environment. Hence, it is especially this first outer face where influences from the ambient on the host matrix and the first luminescent material may start.

It surprisingly appears that an outer layer with a substantially reduced first luminescent material content may have beneficial effects, even though penetration (diffusion) of water and/or air through this layer may occur. Nevertheless, the stability of the first luminescent material and/or lighting device is substantially increased when such layer, of at least 5 µm, even more especially at least 10 µm, such as even more especially at least 15 µm, like at least 20 µm, essentially does not contain the first luminescent material. Hence, in embodiments an outer layer volume defined by at least part of the first outer face and a first distance (d1) from said first outer face hosts the particulate first luminescent material with a first local weight percentage y averaged over the outer layer (volume) with a ratio of the first local weight percentage y over the averaged weight percentage x of $y/x \leq 0.1$, and wherein especially the first distance (d1) is at least 10 µm, such as even more especially at least 15 µm, like at least 20 µm. As especially the availability of the first luminescent material may be essentially zero in the outer layer, especially $y/x \approx 0$. Hence, when by way of example the outer layer of the host matrix includes 5 parts polymeric material and the first luminescent material in the outer layer of the host matrix includes 0.05 part, then the weight percentage y is 1 wt %. Comparing this to the above example, with x being 50 wt %, then $y/x=0.02$, which complies with the condition of $y/x \leq 0.1$. The first local weight percentage y may thus be considered a local bulk weight percentage. The term "first local weight percentage y" refers to the weight of the first luminescent material relative to the total weight of the outer layer. As indicated above, this outer layer at least comprises the polymeric material (that is also available in the remainder of the polymeric host matrix element). This outer layer may further optionally comprise the first luminescent material, and also optionally one or more other materials, such as an optional second luminescent material.

Especially, the first local weight percentage of the first luminescent material in the outer layer relative to the volume of the outer layer is at maximum 100 mg/cm$^3$, such as at maximum 50 mg/cm$^3$, like at maximum 20 mg/cm$^3$.

Further, in specific embodiments the first distance is not larger than 150 µm, such as not larger than 100 µm. Hence, the first distance may be in embodiments selected from the range of 10-100 µm.

The polymeric host matrix element especially comprises a light transmissive material, i.e. transmissive for the light source light and the converter light. Amongst others, especially silicones may be useful (as host matrix material). Hence, the host matrix may especially comprise a polysiloxanes host material. Polysiloxanes for LED applications are well known in the art. Polysiloxanes may herein also be indicated as "silicone". Suitable materials are commercially available, and are e.g. also known as "silicone encapsulants". Alternatively or additionally, the light transmissive material (for the host) may comprise an epoxy (material). Other light transmissive encapsulants may also be possible. A combination of two or more different materials as encapsulant may also be possible. The encapsulant may especially enclose a light emitting surface of a (solid state) light source.

As will be further elucidated below, in embodiments the outer layer may be treated such with a liquid that part of the first luminescent material is extracted by the liquid. In such embodiments, the former locations in the host matrix in the outer layer may become cavities. Therefore, an outer layer defined by at least part of the first outer face and the first distance from said first outer face comprises cavities. These cavities may be internal cavities, having essentially the size of the particles that were available in the cavities, and these cavities may have channels to the external. The cavities may improve the light extraction from the polymeric host matrix element. Additionally, the cavities may prevent reabsorption of light that is generated by the first and/or second luminescent material. Silicone may have some porosity. Hence, through the pores the liquid may enter the outer layer, remove the first luminescent material therefrom, leading to (internal) cavity formation.

The lighting device may especially be based on a (solid state) light source with a reflector cup for beam shaping of the light source light and/or converter light. Hence, in specific embodiments the lighting device further comprises a reflector cup with a first end, a second end and a reflector cup wall between the first end and second end, wherein the reflector cup tapers from the second end to the first end. Further, the polymeric host matrix element has second outer face, wherein the reflector cup hosts the polymeric host matrix element, wherein the first outer face is configured closer to the second end than to the first end, wherein the second outer face is configured closer to the first end than to the second end.

The converter element may reside completely in the reflector cup, or part of the converter element may reside in the reflector cup. Likewise, the polymeric host matrix element may reside completely in the reflector cup, or part of the polymeric host matrix element may reside in the reflector cup. Especially, the first outer face is at an essentially equal position as the second end. Yet further, especially the solid state light source comprises a light emitting surface, and wherein the light emitting surface is in contact with the polymeric host matrix element. The lighting device may have an optical axis, with the reflector cup configured essentially symmetric around this optical axis. Further, the host matrix may (also) be configured essentially symmetric around this optical axis.

The converter element may also include one or more other luminescent materials. These luminescent materials are herein indicated as "second luminescent material". Such second luminescent material may be available in the outer layer or may not. Especially, the polymeric host matrix element may also include one or more second luminescent materials.

Especially, the second luminescent material may comprise $M_3A_5O_{12}:Ce^{3+}$, wherein M is selected from the group consisting of Sc, Y, Tb, Gd, and Lu, wherein A is selected from the group consisting of Al, Ga, Sc and In.

Preferably, M at least comprises one or more of Y and Lu, even more especially M at least comprises Lu, and A at least comprises Al and/or Ga, even more especially A comprises at least Al, even more especially A comprises substantially only Al.

In yet other embodiments, however, A comprises both Al and Ga. In yet further embodiments, A essentially comprises Ga. These types of materials may give highest efficiencies. Especially, in embodiments M consists of at least 50%, such as especially at least 75% of Lu (such as $(Y_{0.05}Lu_{0.9}Ce_{0.05})_3Al_5O_{12}:Ce^{3+}$) appears to provide good results in combination with the second luminescent material. Hence, in embodiments 75% of M consists of Lu. Especially with high Lu containing garnets, the spectral position and the full width half maximum may be as desired. With lutetium, FWHM of at least 100 nm may be achieved. Hence, the first luminescent material light especially has a full width half maximum (FWHM) of at least 100 nm. Likewise, this may apply for garnets where A substantially comprises Ga. Hence, especially the Al/Ga ratio is low when the Lu/Y ratio is low, or especially the Ga/Al ratio is low when the Y/Lu ratio. Hence, in specific embodiments the first luminescent material comprises one or more of $Lu_3Al_5O_{12}:Ce^{3+}$ and $Y_3Ga_5O_{12}:Ce^{3+}$. Alternatively or additionally, $Lu_3A_5O_{12}:Ce^{3+}$ may be applied, with A being selected of one or more of Al and Ga; increasing the Ga content may lead to dominant wavelength shifting to shorter wavelengths.

Embodiments of garnets especially include $M_3A_5O_{12}$ garnets, wherein M comprises at least yttrium and/or lutetium and wherein A comprises at least aluminum. Such garnet may be doped with cerium (Ce), with praseodymium (Pr) or a combination of cerium and praseodymium; especially however with Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3A_5O_{12}:Ce$, wherein x is equal to or larger than 0 and equal to or smaller than 1. The term ":Ce" or ":Ce$^{3+}$", indicates that part of the metal ions (i.e. in the garnets: part of the "M" ions) in the luminescent material is replaced by Ce. For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will especially be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. The term "YAG" especially refers to M=Y and A=Al; the term "LuAG" especially refers to M=Lu and A=Al.

Alternatively or additionally, the second luminescent material may comprise one or more materials selected from the group consisting of (Ba,Sr,Ca)(S,Se):Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba.

The material (Ba,Sr,Ca)(S,Se):Eu can also be indicated as M(S,Se):Eu, or ML, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). L may refer to one or more of sulphur (S) and selenium (Se). The element "(S,Se)" may (thus) indicate that the element sulphur and/or the element selenium may be applied. In general, mainly sulphur may be applied, such as 100% S for the L element in ML.

Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Especially, a combination of (i) a green and/or yellow luminescent material and (ii) an orange luminescent material are applied as second luminescent material(s) in combination with the first luminescent material. Therefore, in embodiments the polymeric host matrix element further comprises a second luminescent material, wherein the second luminescent material comprises one or more luminescent materials selected from the group of (a) a luminescent material of the type of $M_3A_5O_{12}:Ce^{3+}$, wherein M is selected from the group consisting of Sc, Y, Tb, Gd, and Lu, wherein A is selected from the group consisting of Al, Ga, Sc and In, and (b) a luminescent material selected of the type of $MAlSiN_3:Eu$, wherein M is selected from the group consisting of barium (Ba), strontium (Sr) and calcium (Ca). Even more especially, $M_3A_5O_{12}:Ce^{3+}$ is applied wherein M at least comprises yttrium and wherein A at least comprises gallium, such as at least gallium and aluminum, and/or $MAlSiN_3:Eu$, wherein M comprises both strontium and calcium. Especially, both these second luminescent materials, as well as the first luminescent material, are applied. With such embodiments, it is possible to provide a lighting device that is configured to provide white lighting device light, especially having a color temperature equal to or lower than 3000 K, and having a CRI of at least 80.

The lighting device may optionally include further optics. Such further optics may be configured downstream of the polymeric host matrix element. Suitable optics may include e.g. a lens, refractive based or TIR (Total Internal reflection) based structures. Examples of lenses may include one or more of spherical, aspherical, biconvex, plano-convex, biconcave, plano-concave lenses, Fresnel lenses, holographic lenses, or any combination of these. Examples of refractive based structures may be micro lens structures, prism based structures, or variable prism based structures. Examples of TIR based structures may be prismatic structures configured to (partly) guide the incident light via TIR based reflective side-walls. Further, such optical structures may—in embodiments—be an integral part of the polymeric host matrix element.

The invention also provides in an aspect the polymer host matrix per se, such as e.g. available with the method as described herein (see also below). Hence, in an aspect the invention also provides a polymeric host matrix element hosting a particulate first luminescent material of the type $M_2AX_6$ doped with tetravalent manganese, wherein M comprises an alkaline cation, wherein A comprises a tetravalent cation, and wherein X comprises a monovalent anion, at least comprising fluorine (F), wherein the particulate first luminescent material is available in the polymeric host matrix element with an average weight percentage x averaged over the polymeric host matrix element, wherein the polymeric host matrix element has a first outer face, wherein an outer layer volume defined by at least part of the first outer face and a first distance from said first outer face hosts the particulate first luminescent material with a first local weight percentage y averaged over the outer layer volume with a ratio of the first local weight percentage y over the averaged weight percentage x of y/x≤0.1, and wherein the first distance is at least 5 μm, such as especially at least 10 μm, like in the range of 10-100 μm. Embodiments described in relation to the lighting device also relate to the host matrix per se. The host matrix is a solid body, especially a solid silicone body, which may be arranged or which may be available in a reflector cup.

The lighting device may further comprise or may be functionally coupled to a control system. The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system. The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems.

In yet a further aspect, the invention provides a luminaire or lamp comprising one or more lighting devices as defined herein. Such luminaire or lamp may also include other lighting devices, different from the lighting device described herein. Further, such luminaire or lamp may include a control system configured to control the one or more lighting devices and optional other lighting devices. The lamp may e.g. be a spot light.

In yet a further aspect, the invention also provides a method for providing the polymeric host matrix element, such as especially described above (and below). Hence, in an aspect the invention provides a polymeric host matrix element, the method comprising a starting stage, wherein the materials are provided as mixture, a curing stage wherein polymer starting material in the mixture is polymerized and/or cross-linked to provide the (cross-linked) polymeric host matrix element, and luminescent material removal stage, before, during, and/or after the curing stage, wherein the availability of the first luminescent material in the outer layer is reduced.

Especially, the starting stage may comprise providing a mixture comprising a polymer starting material and the particulate first luminescent material on a support, thereby providing an arrangement of the mixture on the support. The polymer starting material may include (monomeric) material that under the right conditions can polymerize and/or cross-link into the polymeric host material, such as polysiloxane (such as cross-linked polysiloxane). The support may in embodiments be a reflector cup and a support at the first end. For instance, at the first end the solid state light source, or a support with the solid state light source, like a COB, may be available, especially at the first end and closing the reflector cup at the first end. In this way, the mixture may be provided in the reflector cup. The mixture (before curing) is especially a viscous material, such as at least 2 Pa·s, like at least 5 Pa·s. Suitable starting materials may e.g. be Dow Corning siloxane resins, such as Dow Corning OE6650. Suitable polymerizable and/or cross-linkable materials may be materials that are known to form lenses or optical parts for solid state applications.

The weight percentage of the first luminescent material in the starting material may essentially be the same as the average weight percentage x. Likewise, the weight percentage of the polymeric material of the polymeric host matrix element may essentially be the same as the weight percentage of the polymer starting material in the mixture.

When the mixture is provided on the support, a curing stage may take place. However, as indicated below the luminescent material removal stage may be executed first, or may overlap partly with the curing stage. The curing stage comprising curing the mixture to provide the polymeric host matrix element. The viscous mixture hereby becomes a solid host. Curing, such as of siloxane, is known in the art. The polymeric host matrix element may especially comprise cross-linked polysiloxane. Herein, the terms silicone or siloxane in relation to the host matrix especially refer to cross-linked polysiloxane.

The luminescent material removal stage may be executed, before, during, and/or after the curing stage. Hence, the luminescent material removal stage may precede the curing state, may at least partly overlap with the curing stage or may be executed after the curing stage. The curing stage may also be executed during part of the luminescent material removal stage. In the luminescent material removal stage the availability of the particulate first luminescent material in the outer layer is reduced, such that a first local weight percentage y of the first luminescent material averaged over an outer layer volume of the outer layer and an average weight percentage x of the first luminescent material averaged over the polymeric host matrix element (120) reaches a ratio of y/x≤0.1.

The luminescent material removal stage may comprise centrifuging the arrangement. In this way, the (relative large) particles of the first luminescent material may be forced to migrate in a direction away from the first outer face and/or in a direction of the support. Hence, in embodiments a second luminescent material may at least partly still stay available in the outer layer and may be reduced less (or not) relative to a bulk weight percentage (or average weight percentage of the second luminescent material average over the polymeric host matrix element). Note that when there are different second luminescent materials, the weight percentage relate to each type of second luminescent material, respectively.

The term "support" may refer to the reflector cup. The term "support" may also refer to a top of the light source, such as in embodiments the light emitting surface of the light source. The term "support" may also refer to a support for the light source.

The reflector cup and the support for the light source may be reflective for the light of the light source and the light of the converter element. For instance, such reflector cup and/or support for the light source may include a white material or metallic material for providing specular or Lambertian reflection, especially specular reflection. Also, in embodiments some parts may include a white reflective material and other parts may include a metallic material.

The reflector cup may further be shaped to support sedimentation via centrifuging. Reflector cups may have relative shallow cup with a small angle between the wall and the second end. In the present invention, this angle may e.g. be larger than about 15°, such as at least 25°, but especially smaller than 90°, such as smaller than 80°.

The luminescent material removal stage comprises contacting at least part of a first outer face of the polymeric host matrix element with an acid aqueous liquid. Especially good results may be obtained with a citric acid containing (aqueous) liquid, such as an aqueous solution of citric acid having a pH selected from the range of 6 or lower, such as 4 or lower. Other acid liquids with such pH's may also be applied. Further, especially an acid may be applied and/or another complexing agent may be applied that form a complex with the manganese ion, such as citrate (from e.g. citric acid), oxalate (from oxalic acid), etc. Further, especially the liquid may be at elevated temperature, such as at least 40° C. Therefore, in embodiments the acid aqueous liquid comprises citric acid, and wherein acid aqueous liquid has a temperature of at least 40° C. The treatment time may be in the range of 10-120 minutes. The polymeric host may be dipped into the liquid. Especially, essentially only the first outer face is in contact with the liquid.

As after curing removal of the first luminescent material from the outer layer may be more difficult than before curing has essentially terminated, in specific embodiments the luminescent material removal stage precedes at least part of the curing stage.

Further, embodiments described above in relation to the device may in general also apply to the method. Especially, the particulate first luminescent material comprises $K_2SiF_6$ doped with tetravalent manganese, wherein the particulate first luminescent material has a volume averaged particle size selected from the range of 10-40 μm. Further, in specific embodiments the polymer starting material comprises material to polymerize and/or cross-link into a polysiloxanes (such as cross-linked polysiloxanes).

As will be clear from the above, the starting material may also include a second luminescent material, though it may not be excluded that a second luminescent material is provided as coating to the host matrix. Therefore, in embodiments the mixture may further comprise a second luminescent material. Especially, the second luminescent material comprises one or more of luminescent materials selected from the group of (a) a luminescent material of the type of $M_3A_5O_{12}:Ce^{3+}$, wherein M is selected from the group consisting of Sc, Y, Tb, Gd, and Lu, wherein A is selected from the group consisting of Al, Ga, Sc and In, and (b) a luminescent material selected of the type of $MAlSiN_3:Eu$, wherein M is selected from the group consisting of barium (Ba), strontium (Sr) and calcium (Ca).

As indicated above, the host matrix may be provided in a reflector cup. Therefore, in embodiments the method may further comprise providing (i) a reflector cup comprising a reflector cup wall between a first end of the reflector cup and a second end of the reflector cup, wherein the reflector cup tapers from the second end to the first end; (ii) a light source, especially a solid state light source, comprising a light emitting surface configured closer to the first end than to the second end, wherein the support comprises at least part of the reflector cup wall and at least part of the light emitting surface.

In the present invention, the polymeric host matrix element is especially a monolithic element. The starting mixture are cast on a support and cured to provide the body. The host matrix is thus especially not a multi-layer system, but a monolithic body, such as a monolithic polysiloxane body include the first luminescent material and optionally also a second luminescent material, wherein the former is not evenly distributed as there is an outer layer wherein the weight percentage of the first luminescent material is substantially lower than the average (bulk) weight percentage.

Hence, especially a monolithic polymeric host matrix element is provided.

However, in yet a further aspect, a multi-layer based polymeric host matrix comprising element is provided. For instance, in an aspect the invention provides a method of providing a polymeric host matrix comprising element, the method comprising: (i) a starting stage comprising providing a first mixture comprising a polymer starting material and the particulate first luminescent material and a second mixture comprising a polymer starting material and optionally the particulate first luminescent material as multi-layer on a support, thereby providing a multi-layer arrangement of the mixture on the support; and (ii) a curing stage comprising curing the first mixture and the second to provide the polymeric host matrix element. The first mixture may include the first luminescent material with an (average) weight percentage x; the second mixture may include the first luminescent material with an (average) weight percentage y (which may be zero), wherein y/x≤0.1. The first mixture may be provided first on the support, and thereafter the second mixture may be provided on the first mixture, to provide a multi-layer. Alternatively, the second mixture is provided on the support, such as a light transmissive support, and the first mixture is provided on the second mixture, to provide a multi-layer. The layer first deposited may be cured before the second layer is deposited. Alternatively, the second layer may be deposited and then both layers are cured. In general, when a multi-layer based polymeric host matrix comprising element is provided, the second layer does essentially not contain the first luminescent material. However, the second layer, or both the first and the second layer, or only the second layer may (also) optionally comprise a second luminescent material. Further, embodiments described above in relation to the method of providing a polymer host matrix also apply to this multi-layer method. The second layer has a thickness of at least 5 µm, such as at least 10 µm, like in the range of 10-100 µm. Herein, the term "multi-layer based polymeric host matrix comprising element" is applied, as the element may comprise a multi-layer, of which one layer has the function of a host matrix for the first luminescent materials, and a second layer may have such function, but may also include no first luminescent material, and may thus essentially not have a hosting function for the first luminescent material.

Therefore, in yet a further aspect the invention also provides multi-layer based polymeric host matrix comprising element, comprising (i) a first layer comprising the polymeric host matrix hosting a particulate first luminescent material of the type $M_2AX_6$ doped with tetravalent manganese, wherein M comprises an alkaline cation, wherein A comprises a tetravalent cation, and wherein X comprises a monovalent anion, at least comprising fluorine (F), wherein the particulate first luminescent material is available in the first layer with an average weight percentage x averaged over the first layer, (ii) a second layer, forming a multi-layer with the first layer, the second layer comprising second polymeric material, wherein the second polymeric material (for the second layer) may optionally also be configured as polymeric host matrix for the first luminescent material with an average weight percentage y averaged over the second layer, y/x≤0.1. The second layer has a thickness of at least 5 µm, such as at least 10 µm, like in the range of 10-100 µm. Especially, the first layer and the second layer comprise the same polymeric material. Even more especially, the first layer and the second layer comprise polysiloxanes (such as cross-linked polysiloxanes) as polymeric material, wherein in the first layer the polysiloxanes hosts the first luminescent material (and optionally a second luminescent material), and wherein in the second layer optionally the first luminescent material and/or the second luminescent material, but especially only the second luminescent material, or no luminescent material, are available.

The polysiloxanes herein may especially comprise a methyl polysiloxane and/or phenyl polysiloxane and/or methylphenyl polysiloxane. The polysiloxanes in the device may thus be cross-linked.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

The terms "violet light" or "violet emission" especially relates to light having a wavelength in the range of about 380-440 nm. The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
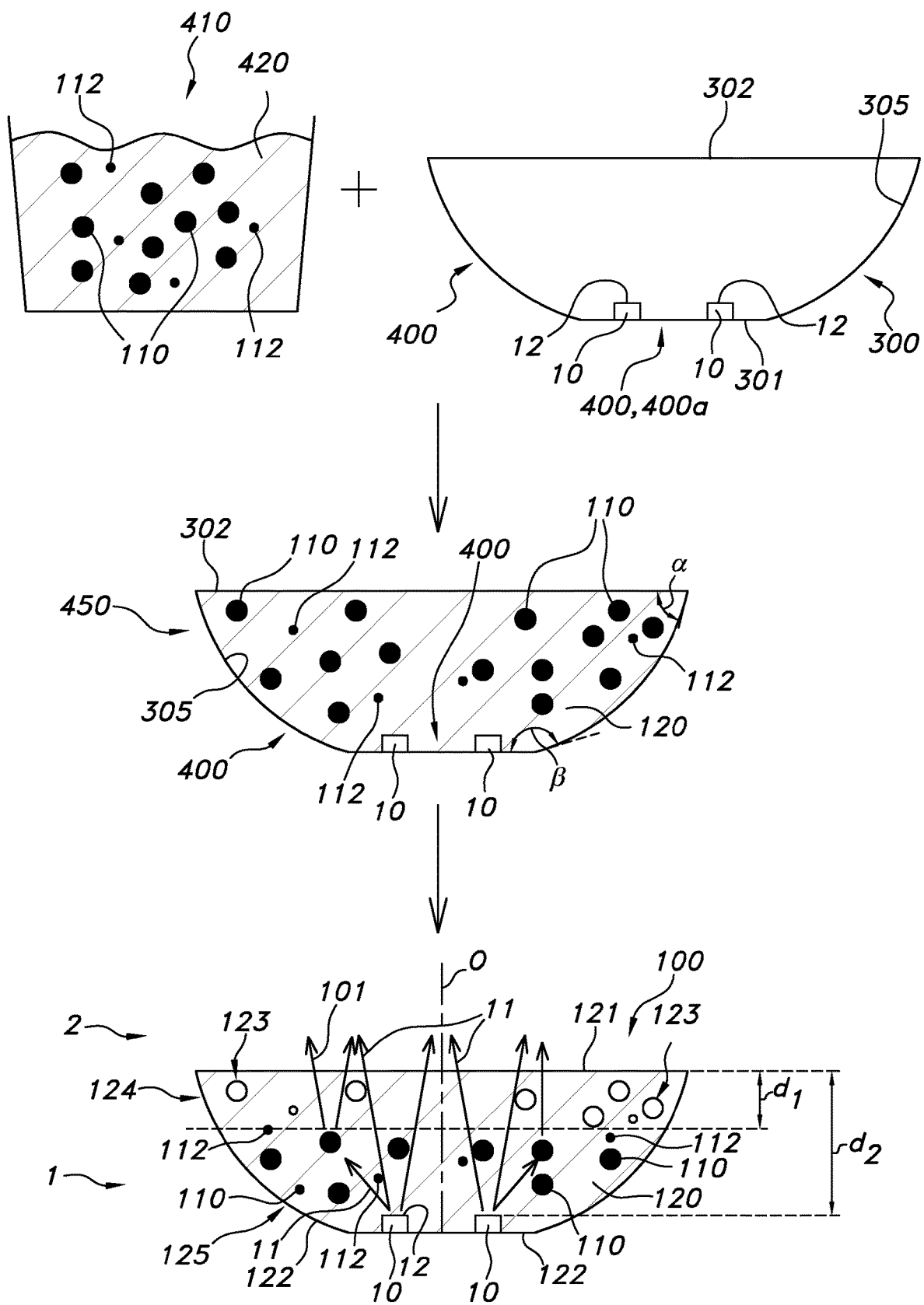
FIGS. 1a-1c schematically depict an embodiment of the method as well as of the polymeric host matrix element and the lighting device, as well as some further aspects.

FIG. 1a schematically depicts an embodiment of a method of providing a polymeric host matrix element 120. The method in this embodiment comprises a starting stage, a curing stage, and a luminescent material removal stage.

The starting stage comprises providing a mixture 410 comprising a polymer starting material 420 and the particulate first luminescent material 110 (and optionally one or more other materials) as well as providing a support. The mixture 410 is provided on the support 400, thereby providing an arrangement 450 of the mixture 410 on the support 400 middle figure in FIG. 1a. Then, the curing stage and the first luminescent material removal stage are executed, wherein in general first the first luminescent material removal stage and then the curing stage are executed. FIG. 1a shows in a single step the end result.

The curing stage comprises curing the mixture 410 to provide the polymeric host matrix element 120. The luminescent material removal stage is executed before, during, and/or after the curing stage, wherein the luminescent material removal stage comprises reducing the availability of the particulate first luminescent material 110 in an outer layer 124 such that a first local weight percentage y of the first luminescent material 110 averaged over an outer layer volume of the outer layer 124 and an average weight percentage x of the first luminescent material 110 averaged over the polymeric host matrix element (120) reaches a ratio of y/x≤0.1. The polymeric host matrix element 120 comprises outer layer 124 and remainder, i.e. non-outer layer part, which is indicated with reference 125

The method may lead to a polymeric host matrix element 120 hosting a particulate first luminescent material 110 on a support. Here, the support includes at least part of a reflector cup and a light source 10, more precisely a support for one or more light sources. The support for the light sources is indicated with reference 400a. As such support 400 is provided, the herein schematically depicted embodiment of the method provides a lighting device 1.

The lighting device 1 comprises a solid state light source 10 configured to generate light source light 11. Here, by way of example two light sources 10 are schematically depicted. The lighting device further comprises a converter element 100 configured to convert at least part of the light source light 11 into converter element light 101, wherein the converter element 100 comprises the polymeric host matrix element 120 hosting a particulate first luminescent material 110 of the type $M_2AX_6$ doped with tetravalent manganese, wherein M comprises an alkaline cation, wherein A comprises a tetravalent cation, and wherein X comprises a monovalent anion, at least comprising fluorine.

The particulate first luminescent material 110 is available in the polymeric host matrix element 120 with an average weight percentage x averaged over the polymeric host matrix element 120, wherein the polymeric host matrix element 120 has a first outer face 121. As schematically depicted in the lower figure in FIG. 1a, an outer layer volume is defined by at least part of the first outer face 121 and a first distance d1 from said first outer face 121. This outer layer, indicated with reference 124, which has the outer layer volume, hosts the particulate first luminescent material 110 with a first local weight percentage y averaged over the outer layer volume with a ratio of the first local weight percentage y over the averaged weight percentage x of y/x≤0.1. The first distance d1 is at least 5 μm, such as 10-100 μm.

Optionally, the mixture 410 may also include a second luminescent material 112. Hence, then also the polymeric host matrix element 120 further comprises the second luminescent material 112.

In embodiments, the luminescent material removal stage comprises centrifuging the arrangement 450.

In embodiments, the luminescent material removal stage comprises contacting at least part of a first outer face 121 with an acid aqueous liquid. Especially in such embodiments the outer layer 124 defined by at least part of the first outer face 121 and the first distance d1 from said first outer face 121 may comprise cavities 123.

FIG. 1a also schematically depicts an embodiment wherein at least part of the support 400 is provided by a reflector cup 300.

Hence, in embodiments the lighting device 1 may further comprise a reflector cup 300 with a first end 301, a second end 302 and a reflector cup wall 305 between the first end 301 and second end 302. As shown, the reflector cup 300 tapers from the second end 302 to the first end 301. The solid state light source 10 comprises a light emitting surface 12. The polymeric host matrix element 120 has second outer face 122, wherein the reflector cup 300 hosts the polymeric host matrix element 120. The first outer face 121 is configured closer to the second end 302 than to the first end 301. The second outer face 122 is configured closer to the first end 301 than to the second end 302. The light emitting surface 12 is in contact with the polymeric host matrix element 120.

Referring to FIG. 1a, the distance between the light emitting surface 12 or the top of the (solid state) light source 10 and the first outer face 121 is indicated with reference d2. Especially, this height may be at least 100 μm, and of course larger than the thickness of the outer layer 124. Especially the height is larger than 200 μm, such as in the range of 200-600 μm.

The reflector cup 300 includes a reflector wall 305. This wall may have an angle α with the second end 302. It may be beneficial when this angle α is larger than about 15°, such as at least 25°, like in the range of 20–60°, or even up to about 90°. The reflector wall 305 may have an angle β with the first end 301. This angle β may especially be smaller than about 145°, such as equal to or smaller than 135°, such as in the range of 95–135°.

Reference O indicates an optical axis of the lighting device 1.

Figure 1B:
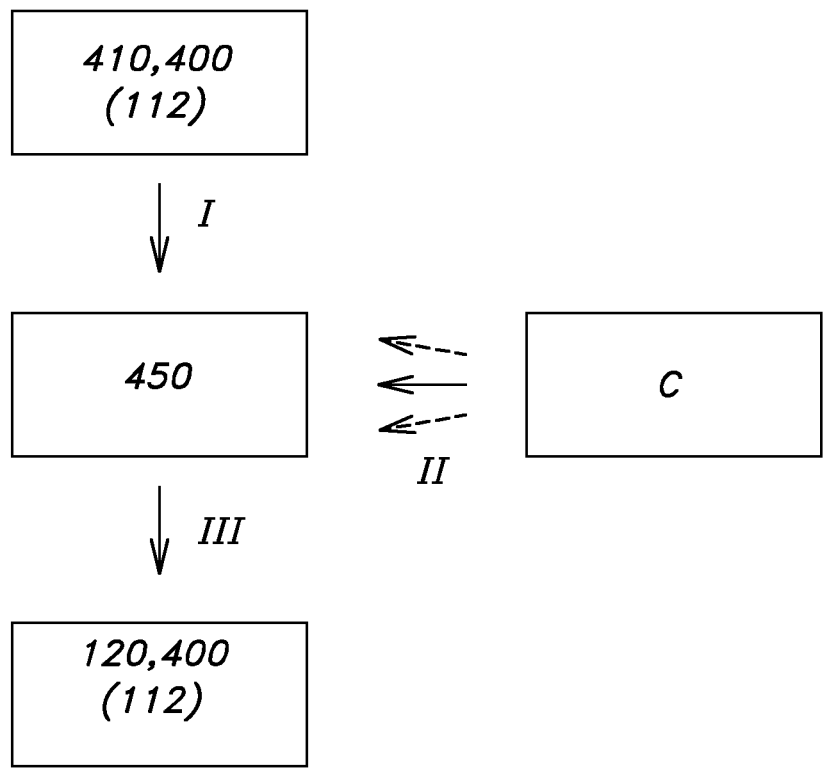

FIG. 1b very schematically depicts a flow chart of the method, starting with providing the starting materials, including the polymer starting material and the first luminescent material, and optionally a second luminescent material, and optionally further material, such as scattering particles, etc. This is provided as mixture 410. Together with a support 400, in a first stage I the arrangement 450 of the mixture 410 and the support 400 is provided.

The method continues to a final stage wherein the polymeric host matrix element 120 is provided via stages II, which is a curing stage (curing is also indicated with "C") and the luminescent material removal stage III. As schematically shown in FIG. 1b, the curing stage may start before, during, or after the luminescent material removal stage III, especially thereafter.

The invention provides a solution wherein the first luminescent material is essentially not exposed to air: all first luminescent material particles close to the silicone-air interface are removed, and all remaining particles are covered with silicone. Some voids (cavities 123) with a diameter of e.g. ~20-40 μm will be present in the silicone (places previously occupied by the phosphor particle) assuming a liquid based first luminescent material removal stage.

In an example, warm white LEDs were made using a mixture of a yellow/green phosphor, an orange phosphor and the red phosphor $K_2SiF_6:Mn^{4+}$ (KSF). Due to the low KSF absorption strength the major part of the orange red phosphors consists of KSF (ratio KSF to orange phosphor ~10:1 in weight). Due to the high-volume fraction of KSF (and the LED processing) some of the KSF is not protected by a (thick enough) silicone layer.

The KSF particles close to/on the surface can be attacked by water, leading to browning, which is very undesired, as this may also lead to excessive heating, resulting in silicone cracking and wire bond breakage. This leads to lumen depreciation. Microscopy of the samples show the occurrence of brown particles after the test times: samples with low KSF content and with high KSF content were tested. Severe browning is already observed after ~400 hours for samples with a high KSF content and ~1000 hours for the samples with a low KSF content. The formation of the brown spots can be accelerated by immersion of the LEDs in (hot) water. In the case of the high [KSF] LED, 30% degradation of the light output is already observed after 3 hours immersion in water of 85° C.; the acceleration factor of this test is thus ~300/3=100.

Surprisingly, it was found that treatment of the LED with a citric acid solution results in the removal of exposed KSF particles without the formation of brown spots. This treatment results in LEDs with an increased stability.

In an example, LEDs were treated with a hot (85° C.) 0.1 M citric acid solution in water for different times (up to 8 hours). The effect of the treatment on the LED color points and light output was measured. CIE u' slightly decreases (some of the KSF is removed from the LED package). This shows that the removal of the KSF particles in the volume close to the top of the device does not induce a color shift. The color point shift upon washing is small, if needed it can be compensated by tuning the target color point at the phosphor dispensing process step to slightly higher u' and lower v', to arrive at the real target color point upon washing. After treatment with citric acid the LEDs were immersed in (normal) water of 85° C. without becoming brown, showing that the KSF particles sensitive to water were effectively removed from the package.

Figure 2:
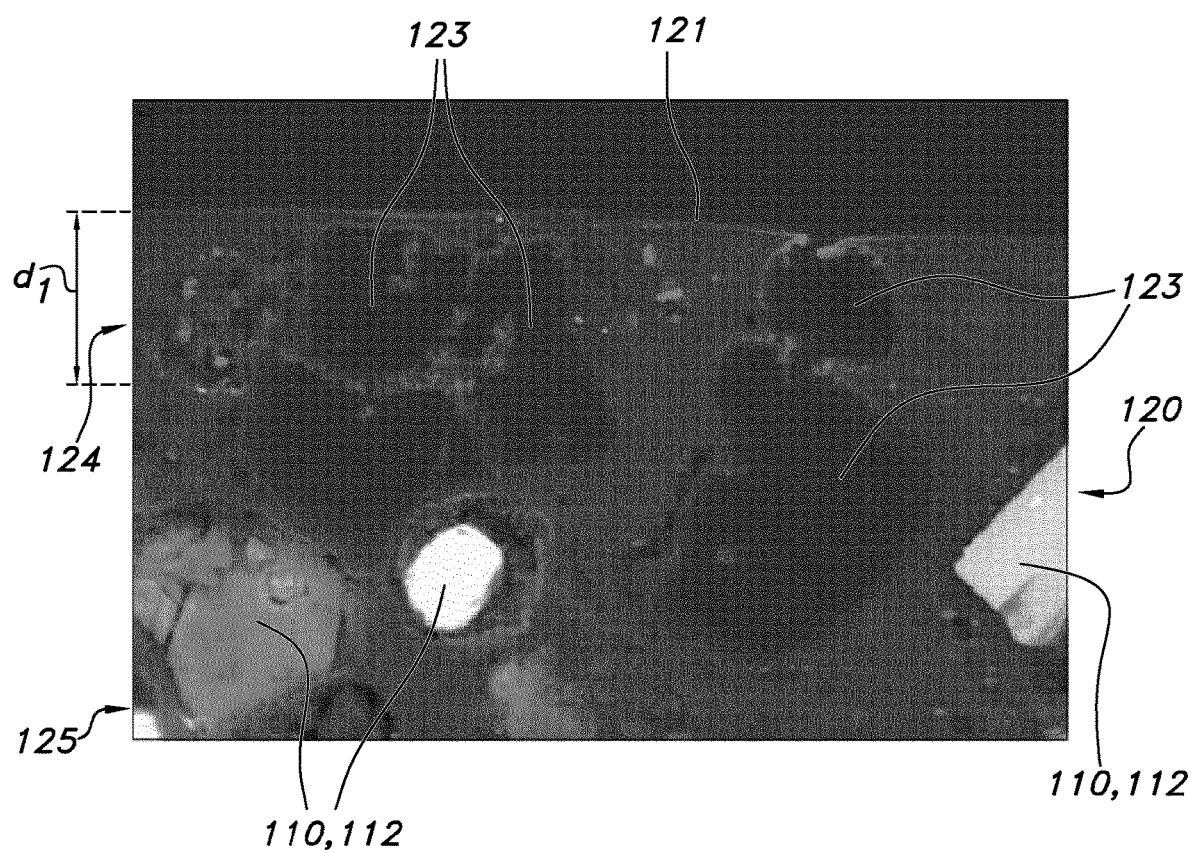
FIG. 2 shows a graph of a polymeric host matrix element wherein an outer layer is treated to reduce the first luminescent material content, leading to voids or cavities.

The application of the washing treatment leads to a silicone layer depleted in KSF, with the presence of 20–40 μm holes, see FIG. 2. The dimensions of the holes or cavities 123 may depend upon the particle size distribution of the first luminescent material particles used.

As indicated above, by creating a phosphor free top layer at the silicone-air interface the degradation of the KSF can be strongly reduced and therefore the reliability can be orders of magnitude better. The phosphor free top layer has especially a thickness of 10-100 μm, especially in the area above and close to the die, where most of the light is generated. Surprisingly, it was found that a phosphor-free layer of ~10 μm is sufficient to prevent browning by KSF even though water molecules can reach KSF particles through the silicone.

Amongst others, the invention provides in embodiments a LED containing a manganese fluoride phosphor and a phosphor-free layer at the top of 5-100 μm, especially 10-100 μm. And dependent claims about the ways to obtain this as described below.

In one embodiment a LED containing a KSF phosphor is coated with a second silicone layer, similar to the silicone used in the phosphor-silicone mixture. The LED is tested in a water immersion test. The lumen maintenance was on average 67% for a LED without such additional layer, whereas the same LED's with an additional phosphor free silicone layer had a maintenance on average of 91%. Hence, a multi-layer solution may also be applied. Hence, creating a phosphor-free second silicone layer can significantly improve the reliability of the lighting device. In another embodiment, the phosphor was sedimented with a centrifuge process step (2 minutes) The LED was tested in a water immersion test and it appeared that creating a phosphor-free layer of 20 micron did significantly improve the reliability of the LED.

Figure 1C:
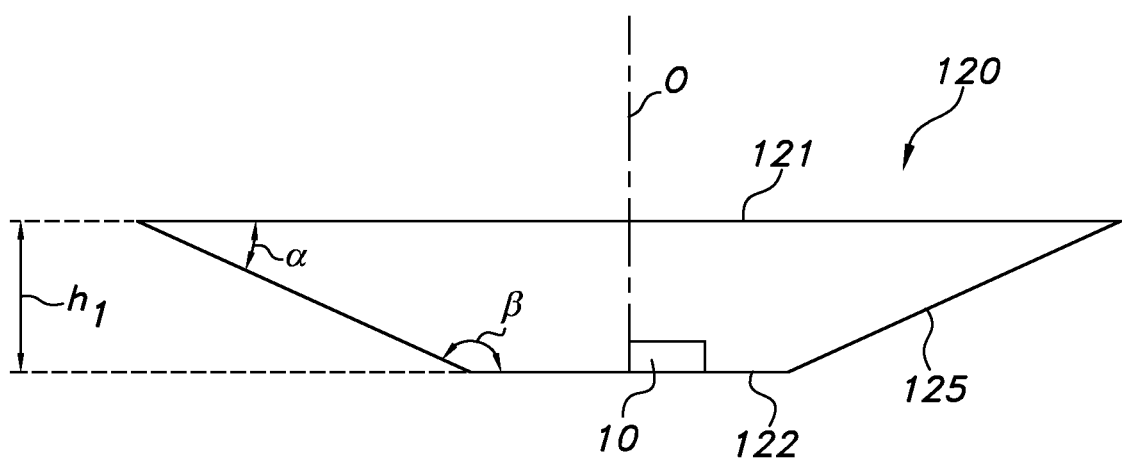

FIG. 1c schematically depicts in some more detail an embodiment of the polymeric host matrix element 120. Here, the polymeric host matrix element has the shape as could be provided by a reflector cup. The polymeric host matrix element 120 has a first outer face 121 and a second outer face 122. The distance between these faces may define a height hi of the polymeric host matrix element 120. The second outer face 121 may be in contact with a support for the light source 10, which is by way of example herein also indicated. The light source 10 is not necessarily exactly in the middle of the polymeric host matrix element 120. Both the polymeric host matrix element and the reflector cup may essentially be symmetrical relative to an optical axis O. The polymeric host matrix element 120 and the reflector cup may have a truncated conical shape, or a truncated tetragonal pyramid shape, a parabolic shape, etc.

FIG. 2 shows a SEM picture of a cross-sectional view of a polymeric host matrix element 120 obtainable with the method of the invention including a washing stage as first luminescent material removal stage. The cavities 123 are well visible.

The term "plurality" refers to two or more.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to". The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device comprising a solid state light source configured to generate light source light and a converter element configured to convert at least part of the light source light into converter element light, wherein the converter element comprises a polymeric host matrix element hosting a particulate first luminescent material of the type $M_2AX_6$ doped with tetravalent manganese, wherein M comprises an alkaline cation, wherein A comprises a tetravalent cation, and wherein X comprises a monovalent anion, at least comprising fluorine (F), wherein the particulate first luminescent material is available in the polymeric host matrix element with an average weight percentage x averaged over the polymeric host matrix element, wherein the polymeric host matrix element has a first outer face, wherein an outer layer volume defined by at least part of the first outer face and a first distance (d1) from said first outer face hosts the particulate first luminescent material with a first local weight percentage γ averaged over the outer layer volume with a ratio of the first local weight percentage γ over the averaged weight percentage x of y/x≤0.1, wherein the first distance (d1) is at least 10 μm and wherein an outer layer defined by at least part of the first outer face and the first distance (d1) from said first outer face comprises cavities.

2. The lighting device according to claim 1, wherein y/x=0.

3. The lighting device according to claim 1, wherein the first distance (d1) is at least 20 μm and at maximum 100 μm.

4. The lighting device according to claim 1, wherein the particulate first luminescent material comprises $K_2SiF_6$ doped with tetravalent manganese, wherein the particulate first luminescent material has a volume averaged particle size selected from the range of 10-40 μm, and wherein the polymeric host matrix element comprises a polysiloxane host material.

5. The lighting device according to claim 1, wherein the polymeric host matrix element further comprises a second luminescent material, wherein the second luminescent material comprises one or more luminescent materials selected from the group of (a) a luminescent material of the type of $M_3A_5O_{12}:Ce^{3+}$, wherein M is selected from the group consisting of Sc, Y, Tb, Gd, and Lu, wherein A is selected from the group consisting of Al, Ga, Sc and In, and (b) a luminescent material selected of the type of $MAlSiN_3$:Eu, wherein M is selected from the group consisting of barium (Ba), strontium (Sr) and calcium (Ca).

6. The lighting device according to claim 1, wherein the cavities have a diameter in the range of 20-40 μm.

7. The lighting device according to claim 1, further comprising a reflector cup with a first end, a second end and a reflector cup wall between the first end and second end, wherein the reflector cup tapers from the second end to the first end, wherein the solid state light source (10) comprises a light emitting surface, wherein the polymeric host matrix element has second outer face, wherein the reflector cup hosts the polymeric host matrix element, wherein the first outer face is configured closer to the second end than to the first end, wherein the second outer face is configured closer to the first end than to the second end, and wherein the light emitting surface is in contact with the polymeric host matrix element.

8. A luminaire or lamp comprising one or more lighting devices according to claim 1.

9. A method of providing a polymeric host matrix element as defined in claim 1, the method comprising:
   a starting stage comprising providing a mixture comprising a polymer starting material and the particulate first luminescent material on a support, thereby providing an arrangement of the mixture on the support;
   a curing stage comprising curing the mixture to provide the polymeric host matrix element; and
   a luminescent material removal stage, before, during, and/or after the curing stage, wherein the luminescent material removal stage comprises reducing the availability of the particulate first luminescent material in an outer layer such that a first local weight percentage y of the first luminescent material averaged over an outer layer volume of the outer layer and an average weight percentage x of the first luminescent material averaged over the polymeric host matrix element reaches a ratio of y/x≤0.1 and wherein the luminescent material removal stage comprises contacting at least part of a first outer face with an acid aqueous liquid.

10. The method according to claim 9, wherein the luminescent material removal stage comprises centrifuging the arrangement.

11. The method according to claim 10, wherein the acid aqueous liquid comprises citric acid, and wherein acid aqueous liquid has a temperature of at least 40° C.

12. The method to claim 9, wherein the luminescent material removal stage precedes at least part of the curing stage.

13. The method to claim 9, wherein the particulate first luminescent material comprises $K_2SiF_6$ doped with tetravalent manganese, wherein the particulate first luminescent material has a volume averaged particle size selected from the range of 10-40 μm, wherein the polymer starting material comprises material to polymerize and/or cross-link into a polysiloxane, wherein the mixture further comprises a second luminescent material, wherein the second luminescent material comprises one or more of luminescent materials selected from the group of (a) a luminescent material of the type of $M_3A_5O_{12}:Ce^{3+}$, wherein M is selected from the group consisting of Sc, Y, Tb, Gd, and Lu, wherein A is selected from the group consisting of Al, Ga, Sc and In, and (b) a luminescent material selected of the type of $MAlSiN_3$:Eu, wherein M is selected from the group consisting of barium (Ba), strontium (Sr) and calcium (Ca).

14. The method according to claim 9, the method further comprising providing:

a reflector cup comprising a reflector cup wall between a first end of the reflector cup and a second end of the reflector cup, wherein the reflector cup tapers from the second end to the first end;

a solid state light source comprising a light emitting surface configured closer to the first end than to the second end;

wherein the support comprises at least part of the reflector cup wall and at least part of the light emitting surface.

* * * * *